US012629890B2

(12) United States Patent (10) Patent No.: US 12,629,890 B2
Kothari et al. (45) Date of Patent: *May 19, 2026

(54) 3D PRINTER FRESH AND RECYCLED POWDER SUPPLY MANAGEMENT

(71) Applicant: Peridot Print LLC, Palo Alto, CA (US)

(72) Inventors: Sunil Kothari, Palo Alto, CA (US); Wesley R. Schalk, Vancouver, WA (US); Jun Zeng, Palo Alto, CA (US); Francisco Oblea, Guadalajara (MX); Gary Dispoto, Palo Alto, CA (US)

(73) Assignee: Peridot Print LLC, Palo Alto, CA (US)

( * ) Notice: Subject to any disclaimer, the term of this patent is extended or adjusted under 35 U.S.C. 154(b) by 837 days.

This patent is subject to a terminal disclaimer.

(21) Appl. No.: 17/824,069

(22) Filed: May 25, 2022

(65) Prior Publication Data

US 2022/0288854 A1      Sep. 15, 2022

Related U.S. Application Data

(63) Continuation of application No. 16/098,098, filed as application No. PCT/US2016/043013 on Jul. 19, 2016, now Pat. No. 11,440,260.

(51) Int. Cl.
  *G06F 3/048*      (2013.01)
  *B22F 10/73*      (2021.01)
      (Continued)
(52) U.S. Cl.
  CPC ............ *B29C 64/357* (2017.08); *B22F 10/73* (2021.01); *B22F 10/85* (2021.01); *B22F 12/55* (2021.01);
      (Continued)

(58) Field of Classification Search
  CPC ... B29C 64/357; B29C 64/153; B29C 64/141; B29C 64/393; B29C 64/321; B22F 10/73;
      (Continued)

(56) References Cited

U.S. PATENT DOCUMENTS

2003/0063138 A1      4/2003  Varnon
2005/0068562 A1      3/2005  Ferlitsch
      (Continued)

FOREIGN PATENT DOCUMENTS

CN        101495294        7/2009
CN        102239045        11/2011
      (Continued)

OTHER PUBLICATIONS

3D Systems' Cube 3 and CubePro 3D printers available to pre-order, starting at $999; May 21, 2014; http://www.3ders.org/articles/201405213dsystemscube3andcubepro3dprintersavailabletopreorder.html.

*Primary Examiner* — Aleksey Olshannikov
(74) *Attorney, Agent, or Firm* — Michael Dryja

(57)      ABSTRACT

Examples disclosed herein relate to 3D printer fresh and recycled powder supply management. In one implementation, a processor estimates fresh and recycled powder use and recycled powder creation by a 3D printer based on a set of print jobs. The processor may coordinate fresh and recycled powder resources based on the powder estimate and stored information about powder resources.

16 Claims, 5 Drawing Sheets

(51) Int. Cl.

| | |
|---|---|
| *B22F 10/85* | (2021.01) |
| *B22F 12/55* | (2021.01) |
| *B29C 64/153* | (2017.01) |
| *B29C 64/357* | (2017.01) |
| *B33Y 40/00* | (2020.01) |
| *G06F 30/20* | (2020.01) |
| *B22F 10/28* | (2021.01) |

(52) U.S. Cl.
CPC ............ *B29C 64/153* (2017.08); *B33Y 40/00* (2014.12); *G06F 30/20* (2020.01); *B22F 10/28* (2021.01)

(58) Field of Classification Search
CPC .......... B22F 10/85; B22F 12/55; B22F 10/28; B33Y 40/00; B33Y 50/02; G06F 30/20; G06Q 10/04; G06Q 50/04
See application file for complete search history.

(56) References Cited

U.S. PATENT DOCUMENTS

| | | | | |
|---|---|---|---|---|
| 2008/0006958 | A1 | 1/2008 | Davidson | |
| 2009/0169664 | A1* | 7/2009 | Cox ........................ | B22F 12/63 425/217 |

| | | | | |
|---|---|---|---|---|
| 2010/0161102 | A1* | 6/2010 | Mattes .................... | B22F 10/73 700/120 |
| 2011/0233808 | A1 | 9/2011 | Davidson | |
| 2014/0265048 | A1 | 9/2014 | Burris | |
| 2014/0265049 | A1 | 9/2014 | Burris | |
| 2014/0297014 | A1 | 10/2014 | Iverson | |
| 2014/0339720 | A1 | 11/2014 | Menchik | |
| 2015/0005919 | A1 | 1/2015 | Mcgatha | |
| 2016/0167310 | A1 | 6/2016 | Lee et al. | |
| 2017/0072466 | A1 | 3/2017 | Zehavi | |
| 2017/0120529 | A1 | 5/2017 | Demuth | |
| 2017/0144248 | A1* | 5/2017 | Yoshimura ............. | B22F 12/43 |
| 2019/0054690 | A1 | 2/2019 | Feng | |

FOREIGN PATENT DOCUMENTS

| | | |
|---|---|---|
| EP | 1700686 A2 | 9/2006 |
| JP | 2003340925 | 12/2003 |
| JP | 2006248231 | 9/2006 |
| JP | 2012510390 | 5/2012 |
| JP | 2015085663 | 5/2015 |
| KR | 1020140072093 | 6/2014 |
| KR | 2016-0070477 | 6/2016 |
| WO | WO-2014193311 | 12/2014 |
| WO | WO-2015142377 A1 | 9/2015 |

* cited by examiner

DETERMINE AN AMOUNT OF FRESH POWDER AND RECYCLED POWDER TO BE USED FOR A 3D PRINT JOB ⟋ 300

ESTIMATE AN AMOUNT OF FRESH POWDER AND RECYCLED POWDER TO BE AVAILABLE BASED ON PRINT JOBS SCHEDULED PRIOR TO THE 3D PRINT JOB ⟋ 301

MANAGE POWDER RESOURCES BASED ON THE INFORMATION RELATED TO THE ESTIMATION COMPARED TO THE DETERMINED AMOUNT ⟋ 302

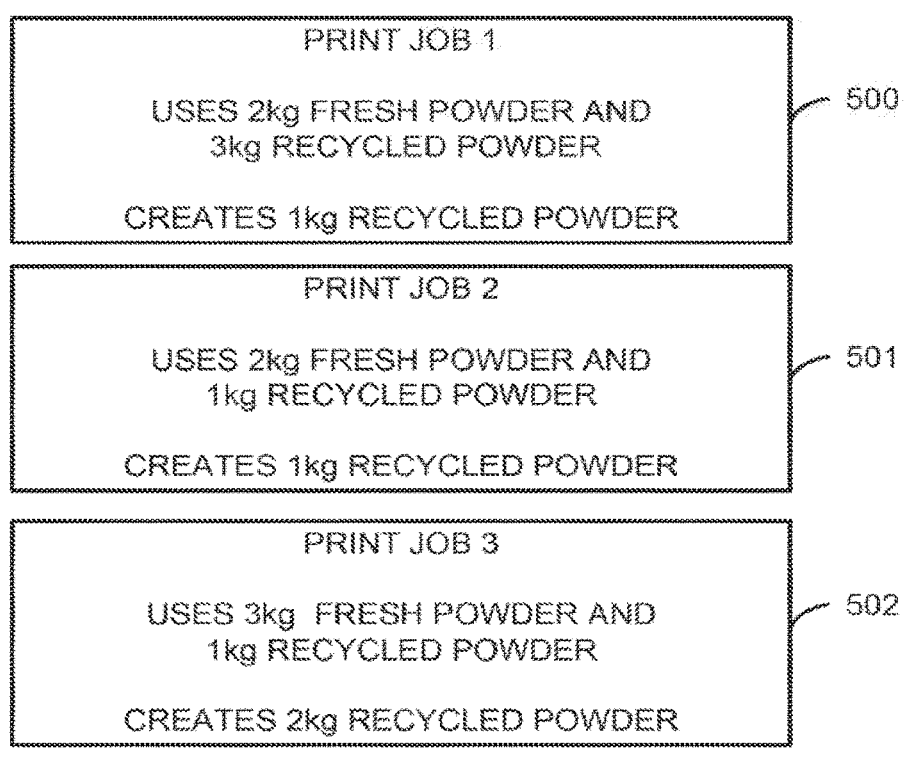

PRINT JOB 1

USES 2kg FRESH POWDER AND
3kg RECYCLED POWDER

CREATES 1kg RECYCLED POWDER

~ 500

PRINT JOB 2

USES 2kg FRESH POWDER AND
1kg RECYCLED POWDER

CREATES 1kg RECYCLED POWDER

~ 501

PRINT JOB 3

USES 3kg  FRESH POWDER AND
1kg RECYCLED POWDER

CREATES 2kg RECYCLED POWDER

SCHEDULE 1 FOR 3D PRINTER
WITH 7kg OF FRESH POWDER
AND 2kg  RECYCLED POWDER
IN PRIMARY STORAGE

PRINT JOB 1
PRINT JOB 2
PRINT JOB 3

1kg RECYCLED POWDER
RETRIEVED FROM
SECONDARY STORAGE

~ 504

SCHEDULE 2 FOR 3D PRINTER
WITH 7kg OF FRESH POWDER
AND 2kg RECYCLED POWDER
IN PRIMARY STORAGE

PRINT JOB 2
PRINT JOB 3
PRINT JOB 1

0kg RECYCLED POWDER
RETREIVED FROM SECONARY
STORAGE

FIG. 5B

3D PRINTER FRESH AND RECYCLED POWDER SUPPLY MANAGEMENT

BACKGROUND

A 3D printer may use different types of powder to create different objects. In some cases, the 3D printer may reclaim remaining powder to be used as recycled powder in another print job. For example, some 3D printed parts may be created using a particular ratio of fresh and recycled powder.

BRIEF DESCRIPTION OF THE DRAWINGS

The drawings describe example embodiments. The following detailed description references the drawings, wherein:

FIGS. 5A and 5B are diagrams illustrating one example of scheduling 3D print jobs based on fresh and recycled powder supply.

DETAILED DESCRIPTION

In one implementation, a processor may predict fresh powder use, recycled powder use, and recycled powder creation based on a set of 3D print jobs and coordinate powder resources based on the prediction. A 3D printer may create parts using fresh powder, recycled powder, or both fresh and recycled powder depending on the type of part being created. The part may be created by fusing powder on a powder bed, and some portions of unfused powder may remain on the powder bed after the part is created, such that the remaining powder may be used in a subsequent part or subsequent layer of the particular part as recycled powder. The amount of supplies available to a 3D printer may change as objects are created with the powder supply. For example, the amount of recycled powder may decrease when used for an object and may increase in cases where the printing process creates more powder to reclaim than recycled powder used. Tracking the supplies may be further complicated by sharing of supplies, such as where some supplies are local to the 3D printer and some are remote. For example, the 3D printer may have a reservoir or cartridge to store supplies, and the primary supplies may be replenished with supplies from a secondary source, such as a remote source shared by multiple 3D printers.

A processor may schedule transfer of fresh and/or recycled powder resources from a secondary supply, such as a remote supply. The processor may determine an amount and identify a source for transferring powder to the 3D printer. The processor may determine a schedule for transferring powder to a printer based on a set of predicted print jobs. For example, the processor may determine an amount of powder to ship to a 3D print shop. A processor may predict future supplies amounts based on simulations of a predicted orders. In some implementations, the processor may re-schedule the creation of objects to change the supply amounts. For example, an object that creates a large amount of recycled powder may be created prior to an order for an object that uses a large amount of recycled powder.

Automatically managing powder supplies may allow for a 3D printer to take advantage of remaining powder that may be reclaimed and used as recycled powder at the particular printer and may allow for resources to be used more efficiently between multiple 3D printers. A processor may schedule print jobs to reduce the number of transfers of powder from secondary sources and/or to schedule the transfers at less disruptive times.

Figure 1:
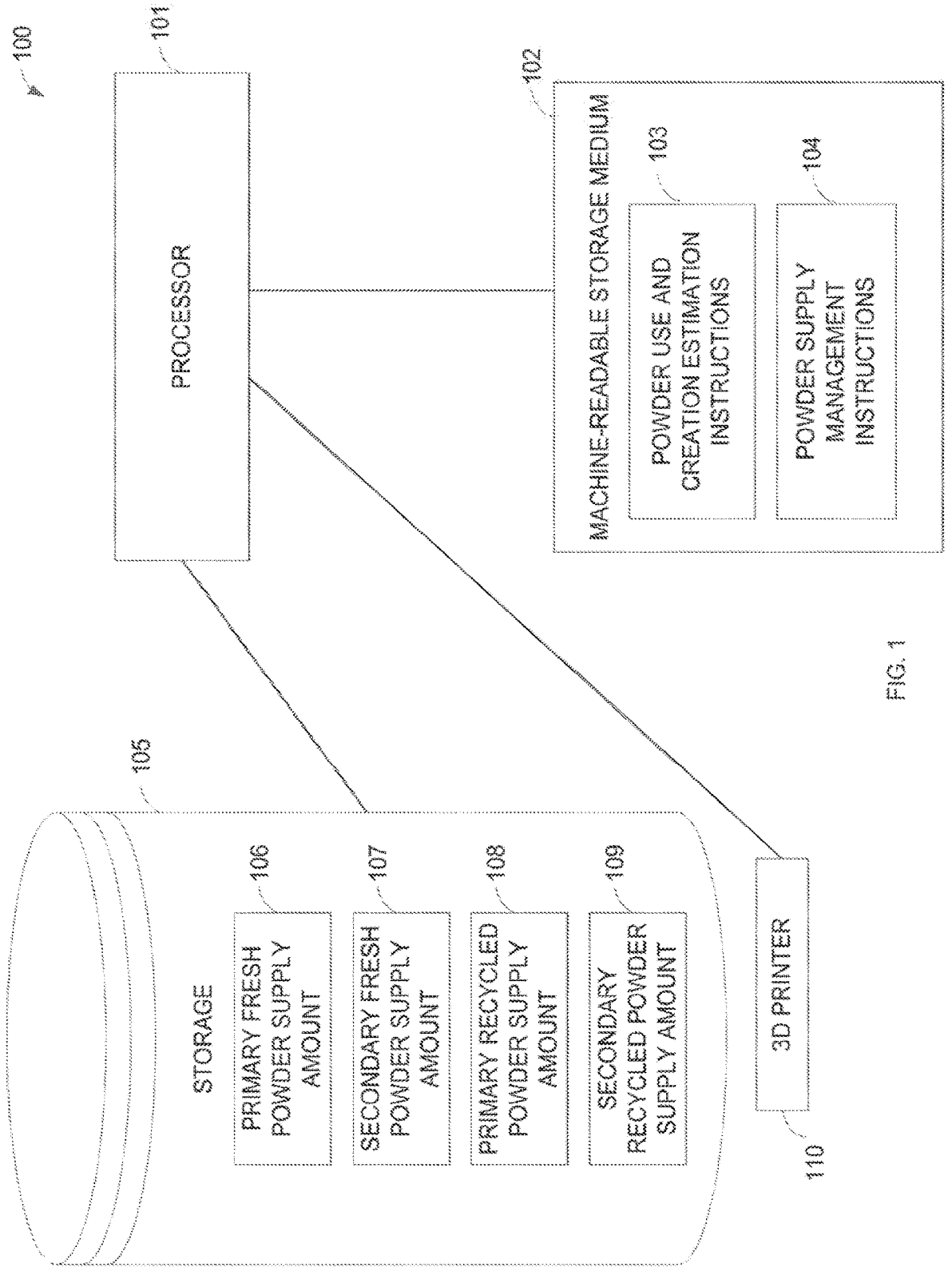
FIG. 1 is a block diagram illustrating one example of a computing system to manage 3D printer fresh and recycled powder supply.

FIG. 1 is a block diagram illustrating one example of a computing system to manage 3D printer fresh and recycled powder supply. For example, the computing system 100 may predict the amount of supplies to be available based on a set of 3D print orders and coordinate the supplies between multiple sources. The sources may be primary and secondary sources that may be dedicated or shared. For example, a 3D printer, such as the 3D printer 110, may have a primary local source of powder and may receive additional powder from a secondary remote source. The computing system 100 includes a processor 101, machine-readable storage medium 102, storage 105, and the 3D printer 110.

The 3D printer 110 may be any suitable 3D printer for performing an additive manufacturing process. The 3D printer 110 may create an object by using a method to fuse powder layer by layer. For example, a layer of powder may be fused using light and/or heat. The 3D printer 110 may include a primary powder supply, such as in a cartridge, hopper, or other reservoir such that the primary powder supply may be added to a powder bed to be fused during the manufacturing process. The primary powder supply may include both fresh and recycled powder, such as in separate reservoirs. There may be remaining powder on the powder bed after printing that is not fused as part of the object, and the remaining powder may in some cases be recycled for reuse. In some implementations, an additional process may occur to make the reclaimed powder ready for reuse. For example, the excess powder may be manually or automatically collected and placed in a reservoir or cartridge, such as a reservoir containing recycled powder. The recycled powder may be stored locally with the 3D printer 110 or may be stored in a secondary storage, such as a storage available to multiple 3D printers.

The storage 105 may store information related to fresh and recycled powder supply. The storage 105 may store information related to a primary fresh powder supply amount 106, secondary fresh powder supply amount 107, primary recycled powder amount 108, and secondary recycled powder amount 109. The processor 101 may store information to and/or access information from the storage 105, such as via a network. In some implementations, the computing system 100 includes multiple storages to store the powder information, such as where the information about amount of primary powder supply for a particular 3D printer is stored locally, and the information is transmitted to the processor 101.

The primary fresh powder supply amount 106 may include any information related to a fresh powder supply amount associated with the 3D printer 110. The primary fresh powder supply may be stored within the 3D printer 110 or otherwise accessible to the 3D printer 110 for a current print job, such as in a connected storage reservoir. The fresh powder may be powder not used in a previous print job.

The secondary fresh powder supply amount 107 may include information about a secondary fresh powder supply separate from the 3D printer 110. For example, the secondary fresh powder may be automatically or manually transferred from a shared fresh powder supply storage to the 3D printer 110. The secondary fresh powder may be stored at a separate site or area than the 3D printer 110.

The primary recycled powder amount 108 may include information about recycled powder dedicated to or created by the 3D printer 110. The recycled powder amount 108 may include powder created from print jobs from the 3D printer 110 or from other 3D printers, and the recycled powder may be stored in a cartridge or reservoir of the 3D printer 110.

The secondary recycled powder amount 109 may include information about recycled powder stored remotely from the 3D printer 110, such as in a shared storage supply. The recycled powder may be transported to the 3D printer 110 and added to the primary recycled powder supply.

The storage 105 may store additional information about the powder amounts. For example, there may be multiple types of fresh or recycled powder, such as powders of different materials. The storage 105 may store information about the makeup of a recycled powder and/or amount of times reclaimed. The storage 105 may store information, such as the weight, type, and other features of the fresh powder.

The processor 101 may be a central processing unit (CPU), a semiconductor-based microprocessor, or any other device suitable for retrieval and execution of instructions. As an alternative or in addition to fetching, decoding, and executing instructions, the processor 101 may include one or more integrated circuits (ICs) or other electronic circuits that comprise a plurality of electronic components for performing the functionality described below. The functionality described below may be performed by multiple processors. The processor 101 may provide a cloud service to the 3D printer 110 and to other 3D printers. In one implementation, the processor 101 is part of the 3D printer 110, such as where the processor 101 manages additional operations of the 3D printer 110.

The processor 101 may communicate with the machine-readable storage medium 102. The machine-readable storage medium 102 may be any suitable machine readable medium, such as an electronic, magnetic, optical, or other physical storage device that stores executable instructions or other data (e.g., a hard disk drive, random access memory, flash memory, etc.). The machine-readable storage medium 102 may be, for example, a computer readable non-transitory medium. The machine-readable storage medium 102 may include powder use and creation estimation instructions 103 and powder supply management instructions 104.

The powder use and creation estimation instructions 103 may include instructions to estimate fresh and recycled powder use and recycled powder creation by the 3D printer 110 based on a set of print jobs. For example, the estimation may be based on information associated with the print jobs, such as type of powder. The estimation may include a range of an amount of powder to be used. In one implementation, the processor estimates the powder supply based on a simulation that uses data from past print jobs and the associated powder amounts used. The processor may execute the simulation and/or access stored information related to the simulation.

In one implementation, the processor may update the set of print jobs based on the estimation. For example, the processor may update the schedule to change the primary and/or secondary recycled powder amount available for a subsequent print job. The processor may update information about the contents of the print job, such as where a ratio of fresh to recycled powder is updated based on supply. For example, in some cases there may be multiple ratios that may results in a correct printed part, and the processor may update the ratio based on the availability of fresh and/or recycled powder.

The powder supply management instructions 104 may include instructions to coordinate fresh and recycled powder resources between a primary and secondary source based on the powder estimate and the stored information about powder resources, such as the primary fresh powder supply amount 106, secondary fresh powder supply amount 107, primary recycled powder supply amount 108, and secondary recycled powder supply amount 109.

The instructions to coordinate the powder supply may include instructions to transfer powder supply from a secondary to a primary source or vice versa. For example, the processor 101 may determine if the estimated amount of fresh powder for a print job is available in the primary fresh powder supply based on the primary fresh powder supply amount 106. If not available, the processor 101 may determine an amount of fresh powder supply to retrieve and a target fresh powder supply location to meet the estimated amount of fresh powder. For example, the processor 101 may select a fresh powder supply storage area and an amount to be retrieved.

The 3D printer 110 may use the powder supply in any suitable manner. For example, the powder supply may be premixed in a reservoir prior to being placed on the powder bed, or the types or powder, such as recycled and fresh powder, may be mixed once added to the 3D printer. In one implementation, a reservoir may include a particular ratio of fresh to recycled powder, and powder from the particular reservoir may be used when the particular ratio is desired. A secondary storage may include a recycled powder with a particular ratio of fresh and recycled powder.

The processor may update the powder supply information in the storage 105 when a print job completes. For example, the processor may reduce the amount of fresh and recycled powder based on use and increase the creation of recycled powder from the completed print job.

In one implementation, the computing system 100 includes multiple 3D printers, and coordinating the powder supply involves coordinating the supply between multiple 3D printers executing multiple print jobs. For example, a powder supply from a shared remote source may be coordinated to meet targets amount multiple 3D printers, such as fewer number of transfers of powder from the particular powder supply source. In one implementation, the processor 101 schedules print jobs among a set of 3D printers based on an analysis of the shared powder supply.

Figure 2:
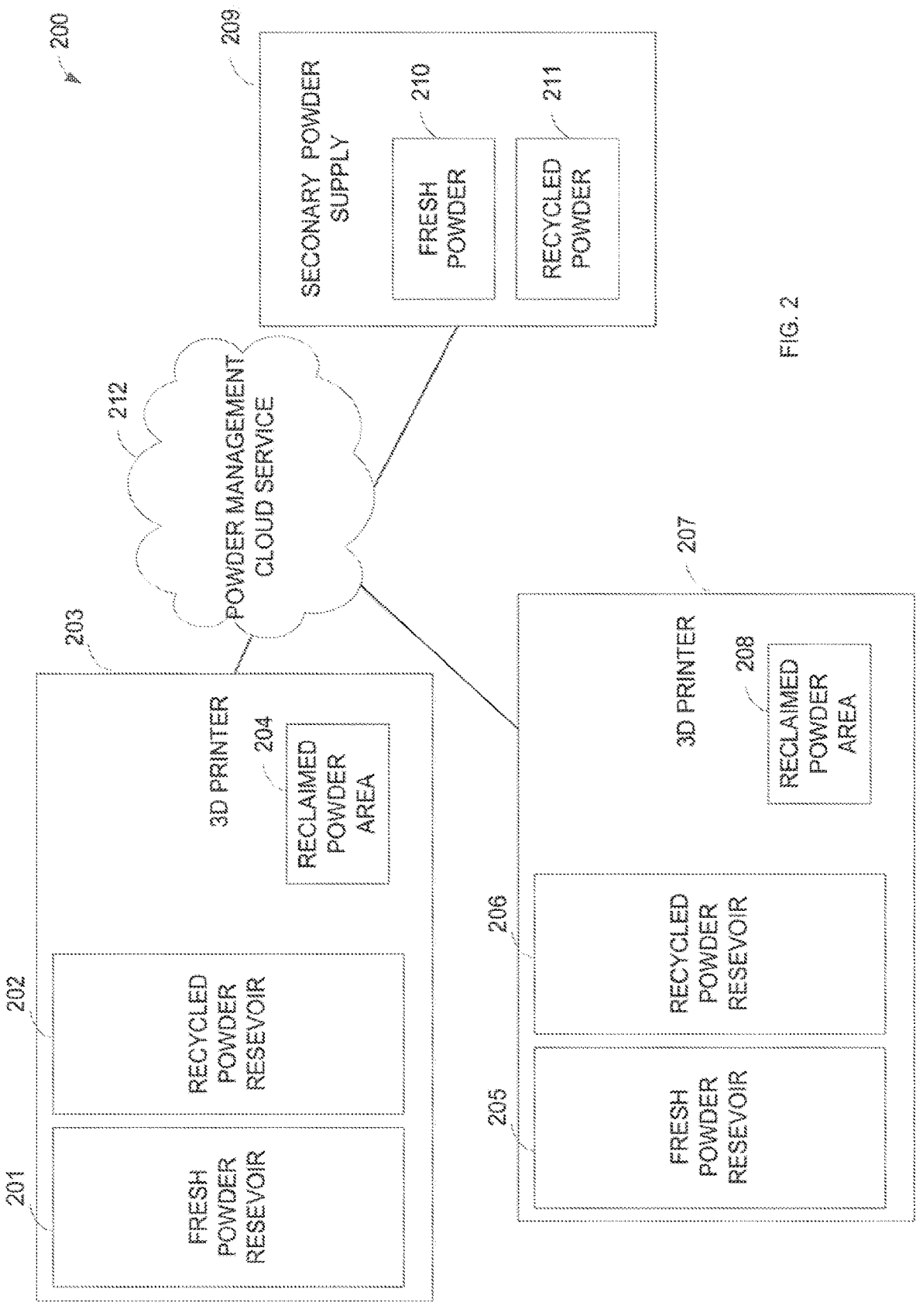
FIG. 2 is a diagram illustrating one example of a 3D print computing system including a powder management cloud service.

FIG. 2 is a diagram illustrating one example of a 3D print computing system 200 including a powder management cloud service 212. The 3D print computing system 200 includes 3D printer 203 and 3D printer 207. The 3D printers 203 and 207 may be at the same location and/or associated with the same entity. In some cases, the 3D printers 203 and 207 may be associated with different entities and/or in different locations such that the 3D printers are not affiliated with one another but share a secondary supply replenishment source, such as the secondary 3D printer powder supply 209. The 3D printers 203 and 207 may each include a primary fresh powder supply, such as the fresh powder reservoirs 201 and 205, and may each include a primary recycled powder supply, such as the recycled powder reservoirs 202 and 206. The primary powder supplies may be within the 3D printer or otherwise associated with the 3D printer and available for use. The powder supply for the 3D printers 203 and 207 may be contained in any suitable manner, such as in a reservoir feeding into a powder bed, a cartridge, or other container. The 3D printers 203 and 207 may each include a reclaimed powder supply, such as reclaimed powder area 204 and 208, such that powder in the reclaimed powder areas 204 and 208 may be transferred to the recycled powder supply of the associated 3D printer. The 3D printers 203 and 207 may use the primary powder supply associated with the individual printers when printing a part and may retrieve additional powder to replenish the primary supplies from the secondary 3D printer powder supply 209, which includes fresh powder 210 and recycled powder 211.

The 3D printers 203 and 207 may use the fresh and recycled powder supplies in any suitable manner, such as where the 3D printer mixes the fresh and recycled powder prior to printing a part or mixes the types or powder beforehand and stores for printing multiple parts that use the same ratio.

The powder management cloud service 212 may include a processor to predict and manage the use of fresh and recycled powder amount supplied to a group of 3D printers and to manage transfer of powder supplies from the secondary 3D printer powder supply 209 to the 3D printers 203 and 207. The powder management cloud service 212 may be implemented, for example, by the processor 101 of FIG. 1.

Figure 3:
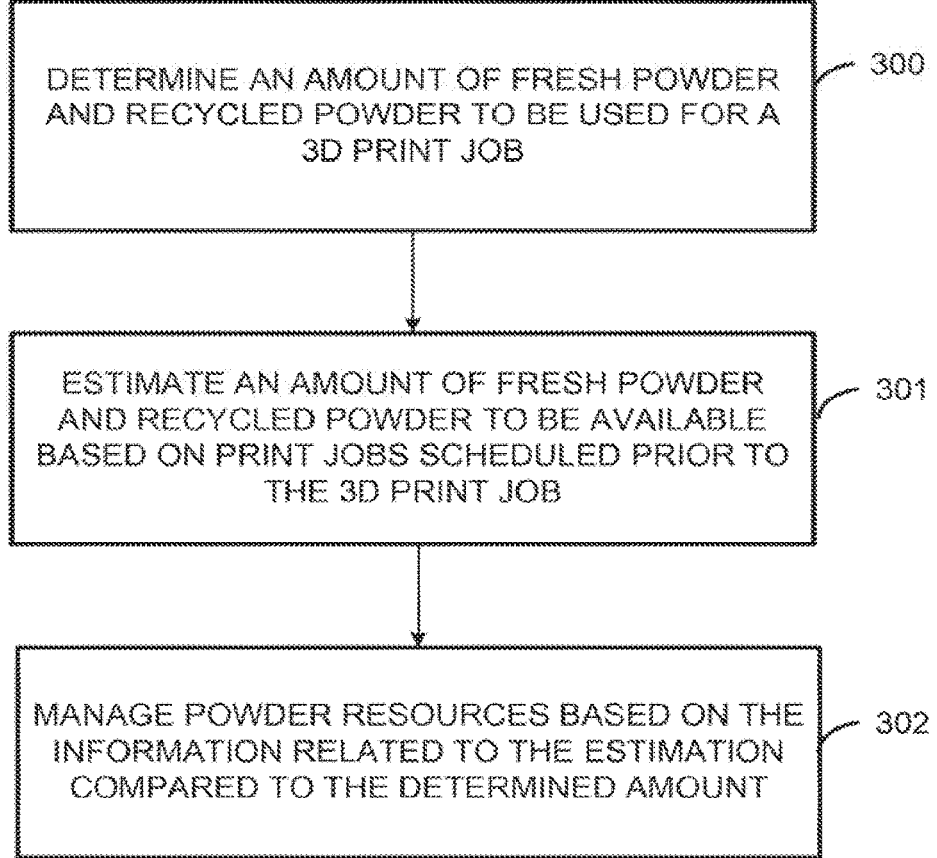
FIG. 3 is a flow chart illustrating one example of a method to manage 3D printer fresh and recycled powder supply.

FIG. 3 is a flow chart illustrating one example of a method to manage 3D printer fresh and recycled powder supply. For example, a processor may predict the amount of fresh and recycled powder, and the amount of increase and decrease due to use, recycling, and retrieving powder from a secondary supply. The processor may manage the powder supply amount for a set of 3D printers such that the processor predicts the powder supply demand based on an actual or projected set of 3D print jobs associated with a 3D printer. For example, a processor may coordinate primary and secondary fresh and recycled powder to meet the actual or predicted print job demand. Coordinating the powder may involve selecting a source, amount, and transfer schedule for powder from a secondary location. In one implementation, coordinating the powder supply may involve changing a parameter of a print job, such as scheduling order or fresh to recycled powder ratio, to alter the powder demand or ability to meet the demand. In some implementations, the processor is a component of the 3D printer. The processor may be part of a cloud based service managing supplies for a 3D printer. The method may be implemented, for example, by the computing system 100 of FIG. 1.

Beginning at 300, a processor determines an amount of fresh powder and recycled powder to be used for a 3D print job. The 3D print job may be any suitable 3D print job, such as for an individual part or final product. The 3D print job may be a scheduled job with an order or may be a predicted type of 3D print job predicted to be created at a 3D printer in a particular time period. For example, the processor may determine or receive a prediction of the type of print jobs to be received during a particular time period.

The 3D print job may use any suitable amount of fresh or recycled powder. For example, a 3D print job may use exclusively fresh or recycled powder or a combination of the two. The 3D print job may complete with residual powder on the powder bed that may be reclaimed as recycled powder to be used in a future print job.

The processor may determine the amount of powder to be used for the 3D print job in any suitable manner, such as based on information from a storage and/or from a simulation. For example, parameters associated with a final part or part features may be associated with a particular amount of powder and type, such as where less powder is needed for a part with an inner hollow portion than for a solid part. Information about the amount of powder and type used for previous print jobs may be compared to target parameters, such as shape and part strength, of a part to be printed for the 3D print job.

Continuing to 301, a processor estimates an amount of fresh powder and recycled powder to be available based on print jobs scheduled prior to the 3D print job. The processor may estimate powder amounts available at different time periods based on scheduled print jobs, such as scheduled based on a product order or a schedule associated with a simulation or projection. The processor may estimate amount of available powder in multiple sources, such as an amount of fresh powder in a primary source and in a secondary source. The primary source may be local to a particular 3D printer, and the secondary source may be a remote shared powder source. For example, the processor may access information about a stored existing primary and secondary supply of fresh and recycled powder, and the processor may predict updated amounts based on a set of print jobs.

The processor may make predictions based on an amount of fresh powder predicted to become recycled powder after a print job. For example, the processor may estimate an amount of powder to be left on a 3D printer powder bed after a print job. The processor may access stored information associated with print job parameters, and estimate the residual powder based on a comparison to other print jobs and the associated residual powder amount for similar printed parts.

The set of 3D print jobs scheduled prior to the print job may be any suitable set of 3D print jobs, such as assigned to a single or multiple printers. The set of 3D print jobs may be associated with a scheduled order. In one implementation, the processor determines a schedule and printer to associate with each print job. The set of 3D print jobs may involve different types of powder, such as a medical device part using fresh powder and a prototype part using recycled powder. A print job may include a ratio of fresh and recycled powder or an acceptable range of fresh and recycled powder.

The processor may predict the fresh powder and recycled powder use and recycled powder creation by the set of print jobs in any suitable manner. The processor may access stored information related to supplies for a print job, such as powder, agents, and other inputs. The predicted amount of powder may be based on past print jobs. For example, the processor may execute a simulation to determine a target powder input amount to create a part with a set of parameters. In one implementation, the processor accesses stored information related to previous print jobs and in some cases related to a simulation. In one implementation, the processor determines a powder usage by a set of print jobs of a particular type to determine the likely remaining resources for the subsequent print job. The processor may predict the demand for multiple types of fresh and recycled powder, such as for multiple types of materials or recycled powder reclaimed from different types of previous print jobs.

Continuing to 302, a processor manages powder resources based on the information related to the estimation compared to the determined amount. The processor may manage powder resources in any suitable manner, such as by rescheduling print jobs, changing a powder type for a print job, or transferring powder from a first source to a second source. The processor may reschedule a print job prior to the 3D print job such that the amount or type of powder available is different based on the schedule such that the powder supply may meet the demand for the 3D print job when scheduled. In one implementation, the processor reschedules the 3D print job for a different 3D printer that has sufficient powder in a primary powder supply. The primary source may be, for example, associated with a particular 3D printer and available for use. The processor may determine an amount of recycled and/or fresh powder to move to a 3D printer from a secondary source based on the demand estimate for the particular type of powder compared to the determined amount.

The processor may coordinate primary and secondary fresh and recycled powder resources based on the comparison of predicted demand to supply information. If a primary powder source is not predicted to include a sufficient amount of fresh or recycled powder for the print job at the scheduled time, the processor may select an amount and source for powder transfer. For example, the processor may automatically predict an amount and time frame for a transfer of fresh or recycled powder from a secondary source to be transferred to a primary source, such as based on when the powder would be used and based on a disruption level in a break from printing or a planned break for cooling or other processes.

In one implementation, the processor changes a parameter of the print jobs based on the powder supply prediction. For example, the processor may update the fresh to recycled powder for a part or change the order of a schedule based on the powder supply prediction. For example, the processor may update the schedule such that more parts may be created from a primary powder supply such that a part creates the recycled supply for a subsequent part.

In one implementation, the processor stores, transmits, and/or displays information related to fresh and recycled powder supply level. For example, the processor may transmit an alert when the primary fresh powder supply is above a threshold and/or an alert indicating a time period at which the primary fresh powder supply is predicted to be below a threshold.

Figure 4:
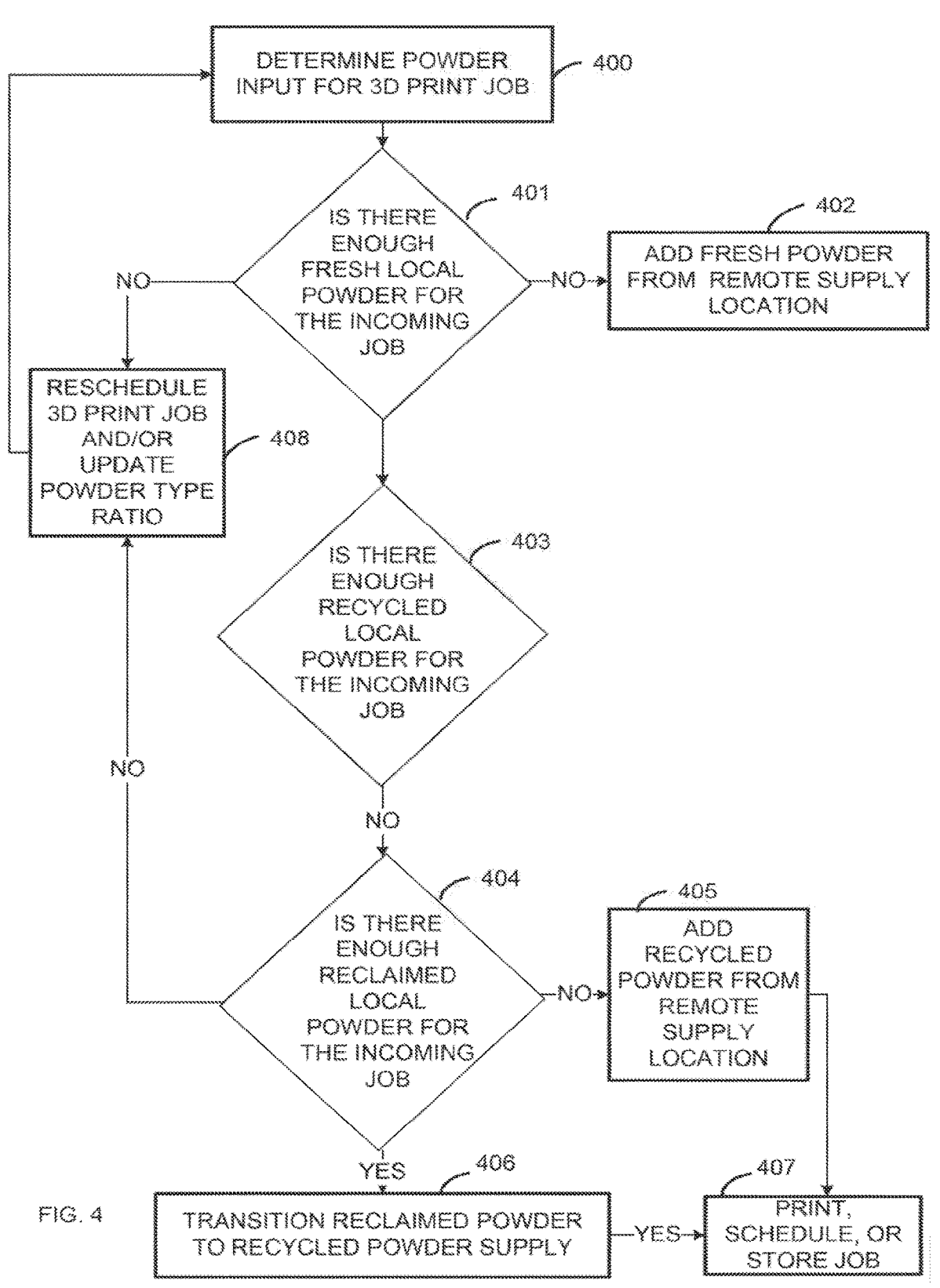
FIG. 4 is a flow chart illustrating one example of a method to manage powder supply for a 3D print job between a local and remote powder source.

FIG. 4 is a flow chart illustrating one example of a method to manage powder supply for a 3D printer between a local and remote powder source. For example, a processor may determine an amount and type of powder associated with a print job and may determine if a change to powder resources should be scheduled to meet the demand of the print job. The 3D printer may have access to multiple powder sources, such as a primary local source associated with the 3D printer and a remote secondary source that may be transferred to the primary source. The method may be implemented, for example, by the computing system 100 of FIG. 1.

Beginning at 400, a processor determines powder input amount for a 3D print job. The print job may be an ordered print job or a print job based on information in a simulation. The processor may determine input requirements for a set of print jobs. The input amount may include an amount of fresh and recycled powder. In some cases, the print job may include a single type of powder, such as a medical device created from fresh powder, and in some cases the print job may include a particular ratio of fresh to recycled powder in order to provide a particular part density or other characteristic. The processor may determine the powder input amount in any suitable manner, such as by accessing information in a storage that includes information about the print job and/or similar print jobs. The processor may determine a range of powder for the print job or an upper limit on the likely powder requirement.

Continuing to 401, the processor determines whether there is enough local fresh powder for the incoming job. For example, the processor may access information related to powder within a reservoir accessible to the 3D printer. The processor may determine the amount of primary fresh powder available based on a number of reservoirs, on a fill level of a reservoir, and/or based on information accessed from a storage. The processor may compare an upper limit of the powder demand for the 3D print job to the amount of available fresh primary powder.

Continuing to 402, if determined that there is not enough local fresh powder supply, the processor causes fresh powder to be added to the local fresh powder supply. For example, the processor may determine an amount of fresh powder to be added.

Continuing to 408, in some implementations, the processor may reschedule and/or change the powder type for the print job and continue to the beginning of the process at 400 with the new parameters. For example, the print job such that a print job that may be executed with the existing fresh primary powder supply is executed prior to adding additional fresh powder. The processor may determine an amount of fresh powder to be added to the primary supply, and the determination may be made based on the print job or on a set of print jobs. The processor may determine a source for the additional fresh powder supply, such as by comparing an amount stored at multiple remote locations.

Continuing to 403, the processor determines if there is enough primary recycled powder supply for the print job. The processor may compare an amount in a reservoir and/or a number of reservoirs in a primary supply to determine whether the recycled powder meets the powder demand for the print job. In some cases, the processor may update a powder ratio for a print job based on the powder supply, such as by determining a range for a ratio of fresh and recycled powder that is acceptable for a print job and selecting a ratio in the range based on the available amount of primary fresh and recycled powder and/or the amount predicted to be available based on a set of scheduled print jobs.

Continuing to 407, if there is enough recycled powder in the primary supply, the processor may print the print job, schedule the print job, store information about the print job to be executed and/or indicate that there is sufficient supply for a simulated print job.

If determined that the primary recycled powder supply is insufficient for the print job, the processor analyzes a reclaimed powder amount. Continuing to 404, the processor determines if there is enough reclaimed primary powder for the print job. The reclaimed powder may be powder residue associated with the 3D printer that has not been transported to a reservoir or other area for reuse or may be an amount of powder to change states from fresh powder to recycled powder based on a scheduled set of print jobs. The processor may determine the amount based on information in a storage and information related to the predicted amount of powder to change from a fresh to a recycled state based on a set of scheduled print jobs. The processor may determine the amount based on a secondary fresh supply to be transferred to the primary supply and changed to recycled powder prior to the print job.

In some implementations, the processor may continue to 408 and reschedule and/or change powder type instead of or in addition to reclaiming primary powder at 404. For example, the method may continue to 400 with the updated parameters.

Continuing to 406, the processor may cause a reclaimed powder amount to be transferred to a position such that it may be used as recycled powder. In some cases, the processor may reschedule the print job such that the transfer may be made when more powder is available to reclaim.

If the processor determines that there is not sufficient primary powder to be reclaimed, the processor may determine a second supply of recycled powder. Continuing to 405, the processor may cause recycled powder to be transferred from a remote supply to the local supply. The processor may determine an amount of powder based on an amount for the print job and additional print jobs. The processor may select a remote supply with a sufficient amount, and in some cases may select multiple sources. The processor may determine a time frame to transfer the powder, such as during down time for the 3D printer. The processor may cause the recycled powder to be automatically transferred or may cause an alert to indicate that the amount of powder from the selected source should be manually transferred.

Continuing to 407, the processor causes the print job to be stored, scheduled, or printed.

FIGS. 5A and 5B are diagrams illustrating one example of scheduling 3D print jobs based on fresh and recycled powder supply. In FIG. 5A, blocks 500, 501, and 502 show a set of 3D print job powder demand and creation estimates. For example, 3D print job 1 described in block 500 uses 2 kg fresh powder and 3 kg recycled powder to create a part and creates 1 kg recycled powder likely to be leftover at the completion of the print job. A processor may simulate multiple schedules for a set of print jobs to determine and compare the simulated schedules to select a schedule based on a set of prioritization factors, such as number of powder transfers.

FIG. 5B shows two scheduling options for the print jobs described in blocks 500, 501, and 502. For example, block 503 shows a first schedule with an order of print job 1, print job 2, and then print job 3 for a 3D printer with a primary powder supply of 7 kg fresh powder and 2 kg recycled powder. Before the first print job, the 3D printer may access 1 kg of recycled powder from a secondary source. After the first print job completes, the 3D printer has 5 kg fresh powder and 1 kg of recycled powder created from the print job that may be reclaimed and used for the second print job. After the second print job completes, the 3D printer has 3 kg fresh powder and 1 kg recycled powder in its primary supply. After the third print job completes, the 3D printer has 2 kg recycled powder to reclaim.

Block 504 shows a second schedule with an order of print job 2, print job 3, and print job 1. The print jobs may be executed in the selected order without retrieving additional recycled powder because the print jobs provide recycled powder that may be reclaimed for future print jobs in the scheduled order. The processor may select the second schedule shown in block 504 based on the fewer number of powder transfers from a secondary source. A computing system to automatically manage powder supplies of different types may allow for a 3D printer to schedule print jobs and receive supplies in a more efficient manner.

The invention claimed is:
1. A computing system, comprising:
a 3D printer;
a computer readable non-transitory medium configured to store information about a primary powder source and a secondary powder source, the stored information including an amount of fresh powder available and an amount of recycled powder available;
the primary powder source comprising a first fresh powder supply and a second recycled powder supply, wherein the primary powder source is local to the 3D printer;

the secondary powder source, wherein the secondary powder source is a remote powder source; and
a processor programmed to:
determine a first amount of fresh powder and a second amount of recycled powder needed for an incoming 3D print job;
estimate a third amount of fresh powder and a fourth amount of recycled powder to be available based on print jobs scheduled prior to the incoming 3D print job; and
manage the first fresh powder supply and the second recycled powder supply of the primary powder source based on a comparison of the determined first amount of fresh powder, the second amount of recycled powder, and the estimated fourth amount of recycled powder; and
cause the 3D printer to print the incoming 3D print job in accordance with the managed first fresh powder supply and the managed second recycled powder supply,
wherein the 3D printer receives a first input from the primary powder source local to the 3D printer and a second input from the secondary powder source that supplies powder to multiple 3D printers, wherein the processor is further configured to estimate a fifth amount of fresh powder and a sixth amount of recycled powder to be available based on print jobs scheduled prior to the incoming 3D print job at all the multiple 3D printers that will affect powder availability from the secondary powder source.

2. The computing system of claim 1, wherein the secondary powder source comprises a second fresh powder supply, and a second recycled powder supply.

3. The computing system of claim 1, wherein the processor is further programmed to update an order of the print jobs to alter a seventh amount of fresh powder and/or an eighth amount of recycled powder to be retrieved from the secondary powder source.

4. The computing system of claim 2, wherein the processor is to manage the primary powder source and the secondary powder source by:
determining, based on the stored information, if the estimated third amount of fresh powder is available in the first fresh powder supply of the primary powder source;
and if not available, retrieving the estimated third amount of fresh powder from the second fresh powder supply of the secondary powder source to meet the estimated third amount of the fresh powder.

5. The computing system of claim 1, wherein the processor is further programmed to update the stored information about the primary powder source and the secondary powder source to reduce a first total amount of fresh powder in the primary powder source and the secondary powder source based on use and to increase a second total amount of recycled powder based on recycled powder creation from use of the fresh powder.

6. The computing system of claim 1, wherein the processor is further programmed to update a ratio of fresh powder to recycled powder of the incoming 3D print job based on the estimated sixth amount of recycled powder.

7. The computing system of claim 1, wherein the processor is to estimate the third amount of fresh powder and the fourth amount of recycled powder to be available based on a simulation using data from past print jobs.

8. A computing system comprising:

a computer readable non-transitory medium configured to store information about a primary powder source and a secondary powder source, the stored information including an amount of fresh powder available and an amount of recycled powder available;

a 3D printer, wherein the 3D printer receives a first input from the primary powder source and a second input from the secondary powder source;

wherein the primary powder source comprising a first fresh powder supply, a first recycled powder supply, wherein the primary powder source is local to the 3D printer;

wherein the secondary powder source comprising a second fresh powder supply, and a second recycled powder supply, wherein the secondary powder source is a remote powder source that supplies powder to multiple 3D printers; and a processor programmed to:

estimate fresh and recycled powder use and recycled powder creation by the 3D printer for an incoming print job based on a set of past print jobs to determine a powder estimate;

update a ratio of fresh to recycled powder of the incoming print job based on the powder estimate;

manage fresh powder resources and recycled powder resources between the primary powder source and the secondary powder source based on the powder estimate and the stored information about the primary powder source and the secondary powder source;

estimate a first amount of fresh powder and a second amount of recycled powder to be available based on print jobs scheduled prior to the incoming print job at the 3D printer and incoming 3D print jobs at all the multiple 3D printers that will affect powder available from the secondary powder source; and cause the 3D printer to print the incoming 3D print job in accordance with the managed fresh powder resources and the managed recycled powder resources.

9. The computing system of claim 8, wherein the processor is further programmed to update an order of the print jobs to alter third amount of powder to be retrieved from the secondary powder source.

10. The computing system of claim 8, wherein the processor is programmed to manage the fresh powder resources by:

determining, based on the stored information, if an estimated amount of fresh powder is available in the first fresh powder supply; and if not available in the first fresh powder supply, determining an amount of fresh powder to retrieve from the second fresh powder supply of the secondary powder source.

11. The computing system of claim 8, wherein the processor is further programmed to update the information about the primary powder source and the secondary powder source stored in the computer readable non-transitory medium based on use and to increase an amount of recycled powder based on recycled powder creation from fresh powder use.

12. The computing system of claim 8, wherein the processor is programmed to estimate estimating fresh powder use and recycled powder creation based on a simulation using data from past print jobs.

13. A powder supply system comprising:

a secondary powder source to supply powder to multiple 3D printers, wherein the secondary powder source is located remotely from the multiple 3D printers; and a powder management system comprising:

a computer readable non-transitory medium storing information about a primary powder source and the secondary powder source including an amount of fresh powder available and an amount of recycled powder available; and a processor programmed to:

receive information from the multiple 3D printers;

determine a first amount of fresh powder and a second amount of recycled powder to be used for an incoming 3D print job at a first 3D printer of the multiple 3D printers;

estimate a third amount of fresh powder and a fourth amount of recycled powder to be available from the primary powder source based on print jobs scheduled prior to the incoming 3D print job;

manage operation of the primary powder source and the secondary powder source based on a comparison of the determined first amount of fresh powder, the second amount of recycled powder and the estimated third amount of fresh powder and the estimated fourth amount of recycled powder;

estimate a fifth amount of fresh powder and a sixth amount of recycled powder to be available based on print jobs scheduled prior to the incoming 3D print job at the first 3D printer and 3D print jobs at all the multiple 3D printers that will affect the powder available from the secondary powder source; and cause the first 3D printer to print the incoming 3D print job in accordance with the managed operation of the primary powder source and the secondary powder source.

14. The powder supply system of claim 13, wherein the computer readable non-transitory medium further stores:

with respect to one of the multiple 3D printers, information about the primary powder source comprising a first fresh powder supply and a first recycled powder supply; and with respect to the secondary powder source comprising a second fresh powder supply and a second recycled powder supply.

15. The powder supply system of claim 13, wherein the processor is further programmed to update an order of the 3D print jobs to alter a seventh amount of fresh powder and an eight amount of recycled powder to be retrieved from the secondary powder source.

16. The powder supply system of claim 13, wherein the processor is programmed to estimate the third amount of fresh powder and the fourth amount of recycled powder to be available based on a simulation using data from past 3D print jobs.

* * * * *